United States Patent [19]

Takahashi

[11] Patent Number: 5,955,753
[45] Date of Patent: *Sep. 21, 1999

[54] SOLID-STATE IMAGE PICKUP APPARATUS AND IMAGE PICKUP APPARATUS

[75] Inventor: Hidekazu Takahashi, Isehara, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/934,561

[22] Filed: Sep. 22, 1997

Related U.S. Application Data

[63] Continuation of application No. 08/688,967, Jul. 31, 1996, abandoned.

[30] Foreign Application Priority Data

Aug. 2, 1995 [JP] Japan ................................. 7-197471

[51] Int. Cl.[6] ........................ H01L 31/062; H01L 31/113
[52] U.S. Cl. ......................... 257/292; 257/231; 257/236; 257/239; 257/296; 257/313; 257/448; 257/461
[58] Field of Search .................................. 257/231, 234, 257/236, 239, 291, 292, 296, 313, 448, 461

[56] References Cited

U.S. PATENT DOCUMENTS 5,220,170 6/1993 Cox et al. ......................... 250/370.09
5,376,813 12/1994 Delbruck et al. ........................ 257/288
5,631,704 5/1997 Dickinson et al. ..................... 348/308

FOREIGN PATENT DOCUMENTS 0481373 4/1992 European Pat. Off. .
0576104 12/1993 European Pat. Off. .

OTHER PUBLICATIONS

"CMOS Active Pixel Image Sensor", IEEE Transactions on Electron Devices, vol. 41, No. 3, Mar. 1994.

*Primary Examiner*—Ngân V. Ngô
*Attorney, Agent, or Firm*—Fitzpatrick,Cella, Harper & Scinto

[57] ABSTRACT

In order to realize a multi-function sensor in which a reduction of a CMOS sensor and an addition of pixel signals are performed in a pixel portion and, further, an addition and a non-addition can be arbitrarily performed, there is provided a solid state image pickup apparatus in which charges generated by a photoelectric converting device are perfectly transferred to a floating diffusion portion through a transfer switch and a change in electric potential of the floating diffusion portion is outputted to the outside by a source-follower amplifier. A few photoelectric converting devices are connected to one floating diffusion portion through the transfer switch. One set of a few source-follower amplifiers are formed for a few pixels. The photoelectric converting device is constructed by an MOS transistor gate and a depletion layer under the gate.

27 Claims, 10 Drawing Sheets

| Cy | Ye |
|----|----|
| Mg | G  |
| Cy | Ye |
| G  | Mg |

ONE PIXEL (ONE UNIT)

FIG. 11B PRIOR ART

FIG. 11C PRIOR ART (AT TIME OF ACCUMULATION)

FIG. 11D PRIOR ART (AT TIME OF TRANSFER)

SOLID-STATE IMAGE PICKUP APPARATUS AND IMAGE PICKUP APPARATUS

This application is a continuation of application Ser. No. 08/688,967 filed Jul. 31, 1996, now abandoned.

BACKGROUND OF THE INVENTION

1. Field of the Invention

The invention relates to an image pickup apparatus for obtaining an image signal and, more particularly, to a solid state image pickup apparatus of an amplifying type of a CMOS process compatible XY address type.

2. Related Background Art

Figures 11A, 11B:
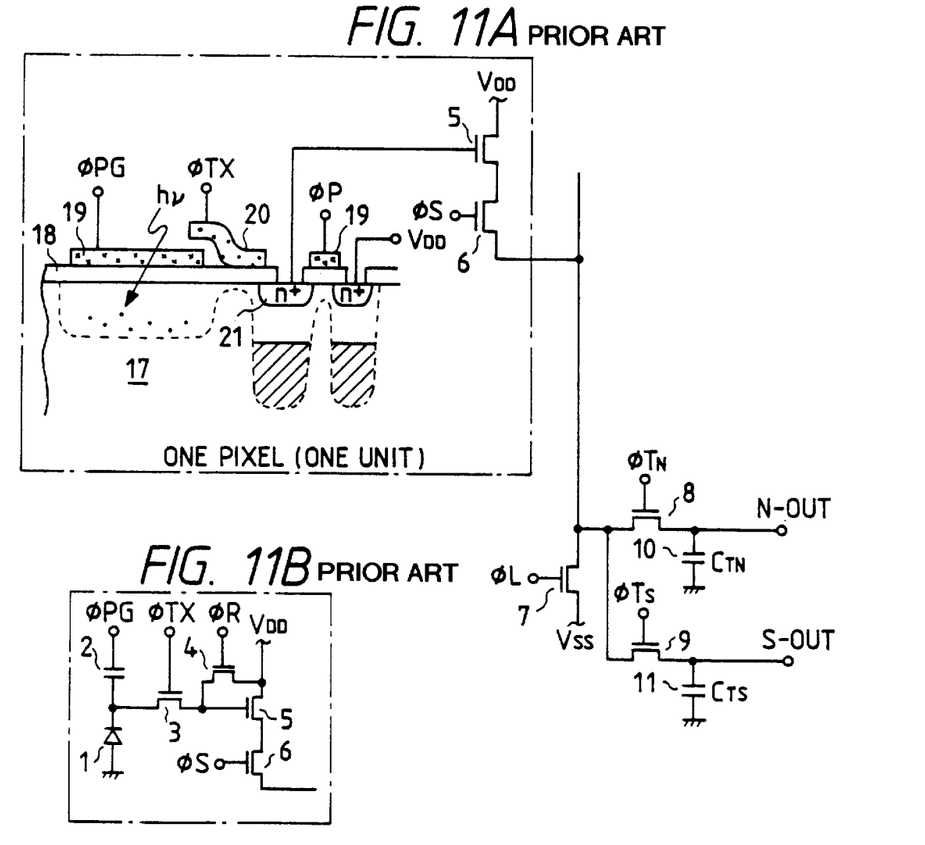
FIGS. 11A to 11D are schematic circuit constructional diagrams of a conventional solid state image pickup apparatus.
Figure 11C:
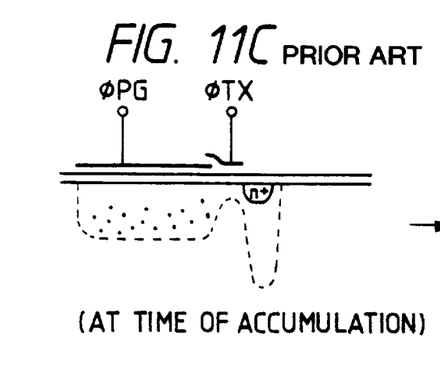
Figure 11D:
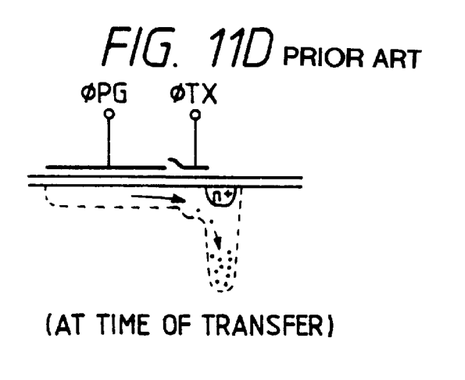

Hitherto, a solid state image pickup device has an MOS structure comprising a metal which can perform a photoelectric conversion, an oxide, and a semiconductor and is mainly classified into an FET type and a CCD type in accordance with a moving system of a light carrier. The solid state image pickup device is used in various fields such as solar cell, imaging camera, copying machine, facsimile, and the like and techniques such as converting efficiency and an integration density have been improved. As one of such amplifying type solid state image pickup apparatuses, there is a sensor of a CMOS process compatible type (hereinafter, abbreviated as a CMOS sensor). Such a type of sensor has been published in a literature such as "IEEE Transactions on Electron Device", Vol. 41, pp 452–453, 1994, or the like. FIG. 11B shows a circuit constructional diagram of a CMOS sensor. FIG. 11A shows a cross sectional view thereof. FIG. 11C shows a state diagram of charges during the accumulation of photons hv of a photoelectric converting unit. FIG. 11D shows a state diagram of charges after the photons hv were accumulated.

In FIGS. 11A and 11B, reference numeral 1 denotes a photoelectric converting unit; 2 a photo gate by an MOS transistor; 3 a transfer switch MOS transistor; 4 an MOS transistor for resetting; 5 a source-follower amplifier MOS transistor; 6 a horizontal selection switch MOS transistor; 7 a source-follower load MOS transistor; 8 a dark output transfer MOS transistor; 9 a light output transfer MOS transistor; 10 a dark output accumulating capacitor; 11 a light output accumulating capacitor.

Reference numeral 17 denotes a p-type well; 18 a gate oxide film; 19 first layer polysilicon; 20 second layer polysilicon; and 21 an n$^+$ floating diffusion region (FD). One of the features of the present sensor is that the sensor is full CMOS transistor process compatible and an MOS transistor of a pixel portion and an MOS transistor of a peripheral circuit can be formed by the same processing step, so that the number of masks and the number of processing steps can be remarkably reduced as compared with those of a CCD.

An operating method will now be simply explained. First, a positive voltage is applied to a control pulse φPG in order to extend a depletion layer under the photo gate 2. The FD portion 21 sets a control pulse φR to the H level and is fixed to a power source $V_{DD}$ in order to prevent a blooming during the accumulation. When the photons hv are irradiated and carriers occur under the photo gate 2, electrons are accumulated in the depletion layer under the photo gate 2 and holes are ejected through the p-type well 17.

Since an energy barrier by the transfer MOS transistor 3 is formed among the photoelectric converting unit 1, p-type well 17, and FD portion 21, the electrons exist under the photo gate 2 during the accumulation of the photo charges (FIG. 11C). When the apparatus enters a reading mode, the control pulse φPG and a control pulse φTX are set so as to eliminate the barrier under the transfer MOS transistor 3 and to completely transfer the electrons under the photo gate 2 to the FD portion 21 (FIG. 11D). Since the complete transfer is executed, an after-image and noises are not generated in the photoelectric converting unit 1. When the electrons are transferred to the FD portion 21, an electric potential of the FD portion 21 changes in accordance with the number of electrons. By outputting a potential change to the external horizontal selection switch MOS transistor 6 through a source of the source-follower amplifier MOS transistor 5 by the source-follower operation, photoelectric converting characteristics of a good linearity can be obtained. Although kTC noises by resetting are generated in the FD portion 21, they can be eliminated by sampling and accumulating a dark output before the transfer of light carriers and obtaining a difference between the dark output and the light output. The CMOS sensor is, therefore, characterized by low noises and a high S/N signal. Since the complete non-destructive reading is performed, multi-functions can be realized. Further, there are also advantages such that a high yield due to an XY address system and a low electric power consumption are obtained.

The above conventional apparatus, however, has drawbacks such that since one photo gate, four MOS transistors, and four horizontal driving lines exist for each pixel, as compared with the sensor of the CCD type, it is difficult to reduce the number of pixels and a numerical aperture also decreases.

There is also a drawback such that since the addition of the photoelectric conversion signals to perform a TV scan is also executed by a peripheral circuit, an operating speed becomes slow.

SUMMARY OF THE INVENTION

It is the first object of the invention to realize a reduction of a CMOS sensor.

The second object of the invention is to realize an execution of an addition of pixel signals by a pixel unit and, further, to realize a multi-function sensor which can arbitrarily execute an addition and a non-addition.

The present invention is made in order to accomplish the above objects and is characterized in that an FD region and a source-follower amplifier provided hitherto for every pixel are formed for a few pixels and a plurality of photoelectric converting regions are connected to the FD region through an MOS transistor switch.

With such a construction, since it is sufficient that one set of a source-follower MOS transistor amplifier, an MOS transistor for selecting a horizontal line, and an MOS transistor for resetting are provided at a few pixel periods of time, the number of devices and the number of wirings which are occupied in each pixel can be reduced than the conventional ones, so that a fine structure can be accomplished.

Since the addition and the non-addition of the signal charges of two pixels can be easily performed at a timing of the transfer MOS transistor to the FD unit, the invention can cope with various driving methods such as color difference line sequential driving, whole pixel independent output driving, and the like.

In the solid state image pickup apparatus, further, the invention is characterized in that the photoelectric converting device comprises an MOS transistor gate and a depletion layer under the gate. It is also characterized in that the MOS transistor gate of the photoelectric converting device is formed by the same processing steps as those of the MOS transistor of the peripheral circuit. It is also characterized in that the photoelectric converting device is a pn junction photodiode. It is further characterized in that the charges of the plurality of photoelectric converting devices can be simultaneously or separately transferred to the floating diffusion portion. It is also characterized by an image pickup apparatus for obtaining image signal outputs by arranging a plurality of solid state image pickup apparatuses. With such a construction, a variety of image signals can be obtained.

The above and other objects and features of the present invention will become apparent from the following detailed description and the appended claims with reference to the accompanying drawings.

DETAILED DESCRIPTION OF THE PREFERRED EMBODIMENTS

Embodiments of the present invention will now be described in detail hereinbelow with reference to the drawings.

Figure 1:
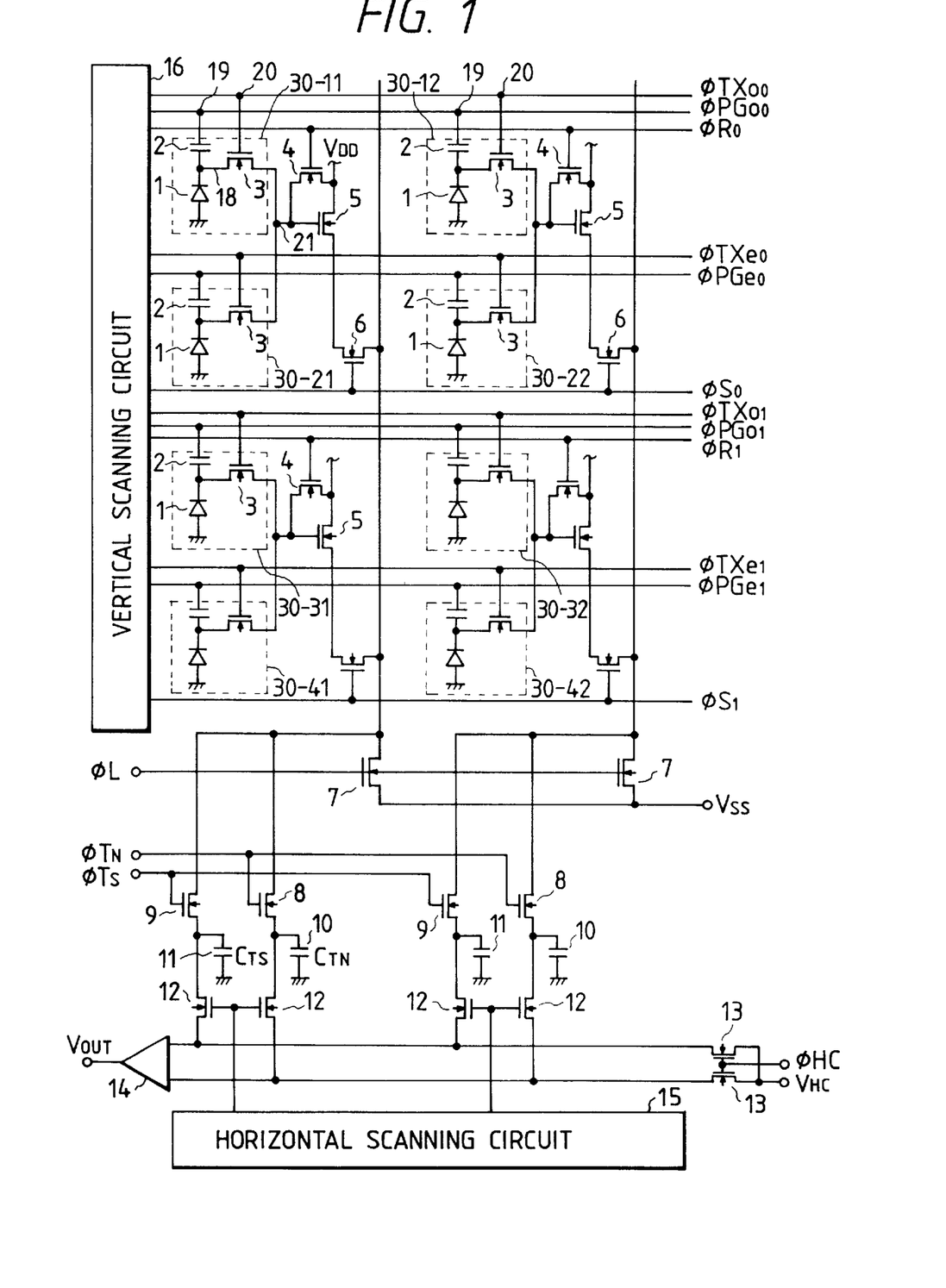
FIG. 1 is a schematic circuit constructional diagram of the first embodiment according to the invention.

FIG. 1 shows a schematic circuit constructional diagram of the first embodiment according to the invention. In the diagram, although a 2-dimensional area sensor of (2 columns×4 rows) pixels is shown, actually, the sensor is magnified and the number of pixels is increased to (1920 columns×1080 rows) or the like, thereby raising a resolution.

In FIG. 1, reference numeral 1 denotes the photoelectric converting unit of a photoelectric converting device comprising an MOS transistor gate and a depletion layer under the gate; 2 the photo gate; 3 the transfer switch MOS transistor; 4 the MOS transistor for resetting; 5 the source-follower amplifier MOS transistor; 6 the horizontal selection switch MOS transistor; 7 the source-follower load MOS transistor; 8 the dark output transfer MOS transistor; 9 the light output transfer MOS transistor; 10 the dark output accumulating capacitor $C_{TN}$; 11 the light output accumulating capacitor $C_{TS}$; 12 a horizontal transfer MOS transistor; 13 a horizontal output line resetting MOS transistor; 14 a differential output amplifier; 15 a horizontal scanning circuit; and 16 a vertical scanning circuit.

Figure 2:
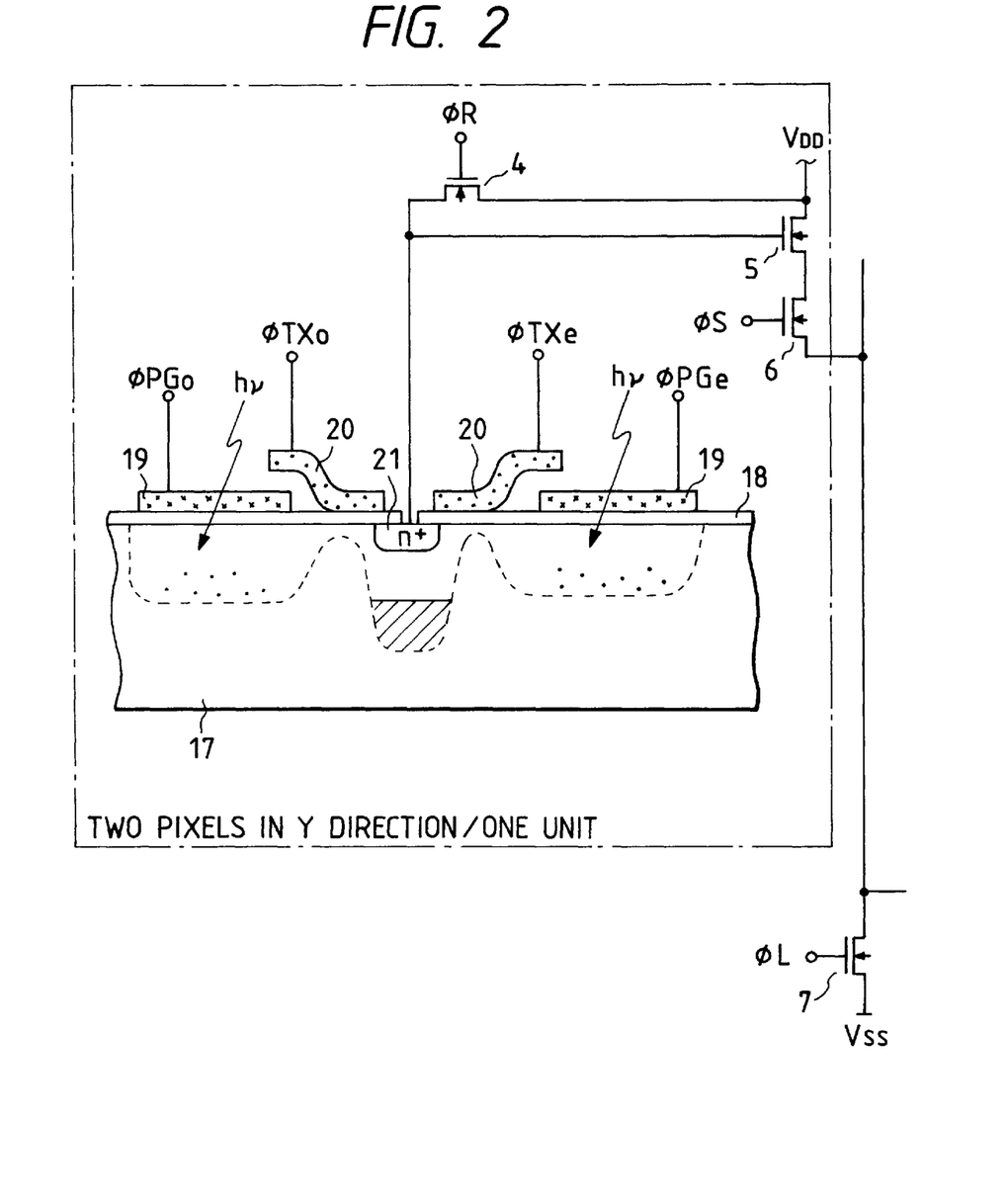
FIG. 2 is a cross sectional view of a pixel in the first embodiment according to the invention.

FIG. 2 shows a cross sectional view of a pixel portion. In the diagram, reference numeral 17 denotes the p-type well; 18 the gate oxide film; 19 the first layer polysilicon; 20 the second layer polysilicon; and 21 the $n^+$ floating diffusion (FD) portion. The FD portion 21 is connected to another photoelectric converting unit through another transfer MOS transistor. In the diagram, drains of two transfer MOS transistors 3 and the FD portion 21 are commonly constructed, thereby realizing a fine structure and the improvement of a sensitivity due to a reduction of a capacitance of the FD portion 21. The FD portion 21, however, can be also connected by an Al wiring.

The operation will now be described with reference to a timing chart of FIG. 3. The timing chart relates to a case of a whole pixel independent output.

First, a control pulse φL is set to the high (H) level by a timing output from the vertical scanning circuit 16 and a vertical output line is reset. Control pulses φR0, φPGqo0, and φPGe0 are set to the high level, the MOS transistor 4 for resetting is turned on, and the first layer polysilicon 19 of the photo gate 2 is set to the H level. At time T0, a control pulse φS0 is set to the H level, the selection switch MOS transistor 6 is turned on, and the pixel portions of the first and second lines are selected. The control pulse φR0 is subsequently set to the low (L) level, the resetting of the FD portion 21 is stopped, the FD portion 21 is set to the floating state, and a circuit between the gate and source of the source-follower amplifier MOS transistor 5 is set into a through state. After that, at time T1, a control pulse φTN is set to the H level, thereby allowing a dark voltage of the FD portion 21 to be outputted to the accumulating capacitor $C_{TN}$ 10 by the source-follower operation.

Subsequently, in order to perform a photoelectric conversion output of the pixels of the first line, a control pulse φTXo0 of the first line is set to the H level and the transfer switch MOS transistor 3 is made conductive. After that, at time T2, the control pulse φPGo0 is set to the L level. In this instance, it is preferable to set to a voltage relation such as to raise a potential well extending under the photo gate 2 and to allow the light generation carriers to be perfectly transferred to the FD portion 21. Therefore, so long as the complete transfer can be performed, the control pulse φTX is not limited to a pulse but can be also set to a fixed electric potential.

At time T2, since the charges from the photoelectric converting unit 1 of the photodiode are transferred to the FD portion 21, the electric potential of the FD portion 21 changes in accordance with the light. In this instance, since the source-follower amplifier MOS transistor 5 is in a floating state, a control pulse φT$_s$ is set to the H level at time T3 and the electric potential of the FD portion 21 is outputted to the accumulating capacitor $C_{TS}$ 11. At this time point, the dark output and light output of the pixels of the first line have been accumulated in the accumulating capacitors $C_{TN}$ 10 and $C_{TS}$ 11, respectively. A control pulse φHC at time T4 is temporarily set to the H level, the horizontal output line resetting MOS transistor 13 is made conductive, and the horizontal output line is reset. The dark output and light output of the pixels are outputted to the horizontal output line in a horizontal transfer period of time by a scanning timing signal of the horizontal scanning circuit 15. At this time, when a differential output $V_{OUT}$ is obtained by the differential output amplifier 14 of the accumulating capacitors $C_{TN}$ 10 and $C_{TS}$ 11, a signal of a good S/N ratio from which random noises and fixed pattern noises of the pixels have been eliminated is obtained. Although photo charges of pixels 30-12 and 30-22 are respectively accumulated in the accumulating capacitors $C_{TN}$ 10 and $C_{TS}$ 11 simultaneously with pixels 30-11 and 30-21, upon reading, a timing pulse from the horizontal scanning circuit 15 is delayed by a time corresponding to one pixel and the charges are read out to the horizontal output line and are generated from the differential output amplifier 14.

In the embodiment, although a construction such that the differential output $V_{OUT}$ is executed in the chip has been shown, a similar effect can be also obtained even if a conventional CDS (Correlated Double Sampling) circuit is used in the outside without including such a construction into the chip.

After the light output was outputted to the accumulating capacitor $C_{TS}$ 11, the control pulse φR0 is set to the H level, the MOS transistor 4 for resetting is made conductive, and the FD portion 21 is reset to the power source $V_{DD}$. After completion of the horizontal transfer of the first line, the second line is read out. Upon reading out the second line, control pulses φXe0 and φPGe0 are similarly driven, high level pulses are supplied as control pulses φTN and φTS, photo charges are accumulated into the accumulating capacitors $C_{TN}$ 10 and $C_{TS}$ 11, and the dark output and light output are taken out, respectively. By the above driving, the reading operations of the first and second lines can be independently executed. After that, a vertical scanning circuit is made operative and the reading operations of the (2n+1)th, (2n+2)th, . . . lines (n=1, 2, . . . ) are similarly executed, so that the outputs of all of the pixels can be independently performed. Namely, in case of n=1, first, a control pulse φS1 is set to the H level and a control pulse φR1 is subsequently set to the L level. After that, control pulses φTN and φTXo1 are set to the H level, a control pulse φPGo1 is set to the L level, a control pulse φTS is set to the H level, and the control pulse φHC is temporarily set to the H level, thereby reading out pixel signals of pixels 30-31 and 30-32, respectively. Subsequently, control pulses φTXe1 and φPGe1 are supplied and the control pulses are applied in a manner similar to those mentioned above, thereby reading out pixel signals of pixels 30-41 and 30-42, respectively.

In the embodiment, since one set of source followers are not provided for one pixel but one set of source followers are provided for two pixels, the numbers of source-follower amplifier MOS transistors 5, selection switch MOS transistors 6, and resetting MOS transistors 4 can be reduced into ½ of the conventional ones. Thus, the numerical aperture of the photoelectric converting unit of the pixel is improved. A fine structure due to an integration of the pixel can be realized. By commonly using the FD portion 21 for two pixels, there is no need to increase a capacitance of the gate portion of the source-follower amplifier MOS transistor 5, so that a deterioration in sensitivity can be prevented.

As another feature of the invention, a point such that the S/N ratio can be improved by adding the signals of two or more pixels in the FD portion 21 can be also mentioned. Such a construction can be realized by changing only a timing of an applying pulse without substantially changing the circuit construction. FIG. 4 shows a timing chart in case of the addition of the pixel signals of two upper and lower pixels. In FIG. 3 showing the non-adding mode, the timings of the control pulses φTXo0 and φTXe0 and the timings of the control pulses φPGo0 and φPGe0 have been respectively shifted by a time of one pixel. However, they are the same timing in case of the addition. That is, since the pixel signals are simultaneously read out from the pixels 30-11 and 30-21, and the control pulse φTN is first set to the H level, a noise component is read out from the vertical output line. The control pulses φTXo0 and φTXe0 and the control pulses φPGo0 and φPGe0 are respectively simultaneously set to the H and L levels and are transferred to the FD portion 21. Thus, the signals of the two upper and lower photoelectric converting units 1 can be added by the FD portion 21 at the same time. Therefore, if two timings by the timing chart in FIG. 3 are prepared, for example, a mode for performing a high resolution image pickup in a bright state and, for example, in a dark state, a mode to execute a high sensitivity image pickup at a simultaneous reading timing by the timing chart of FIG. 4 can be realized by one sensor.

Although the above embodiment has been shown with respect to the example in which two photoelectric converting units are connected to the FD portion 21, a plurality of (for example, 3, 4, or the like) photoelectric converting units can be also connected. With such a structure, for example, an apparatus which can be applied to a wide field such as solid state image pickup apparatus of a high sensitivity, an apparatus of a high density, and the like can be provided by short processing steps by the CMOS process.

In the embodiment, each of the MOS transistors of a pixel portion 30 have been constructed by n type and the manufacturing steps have been simplified. However, it is also obviously possible to construct by all of the PMOS transistors by using an n-type well for a p-type substrate or vice versa.

Figure 5:
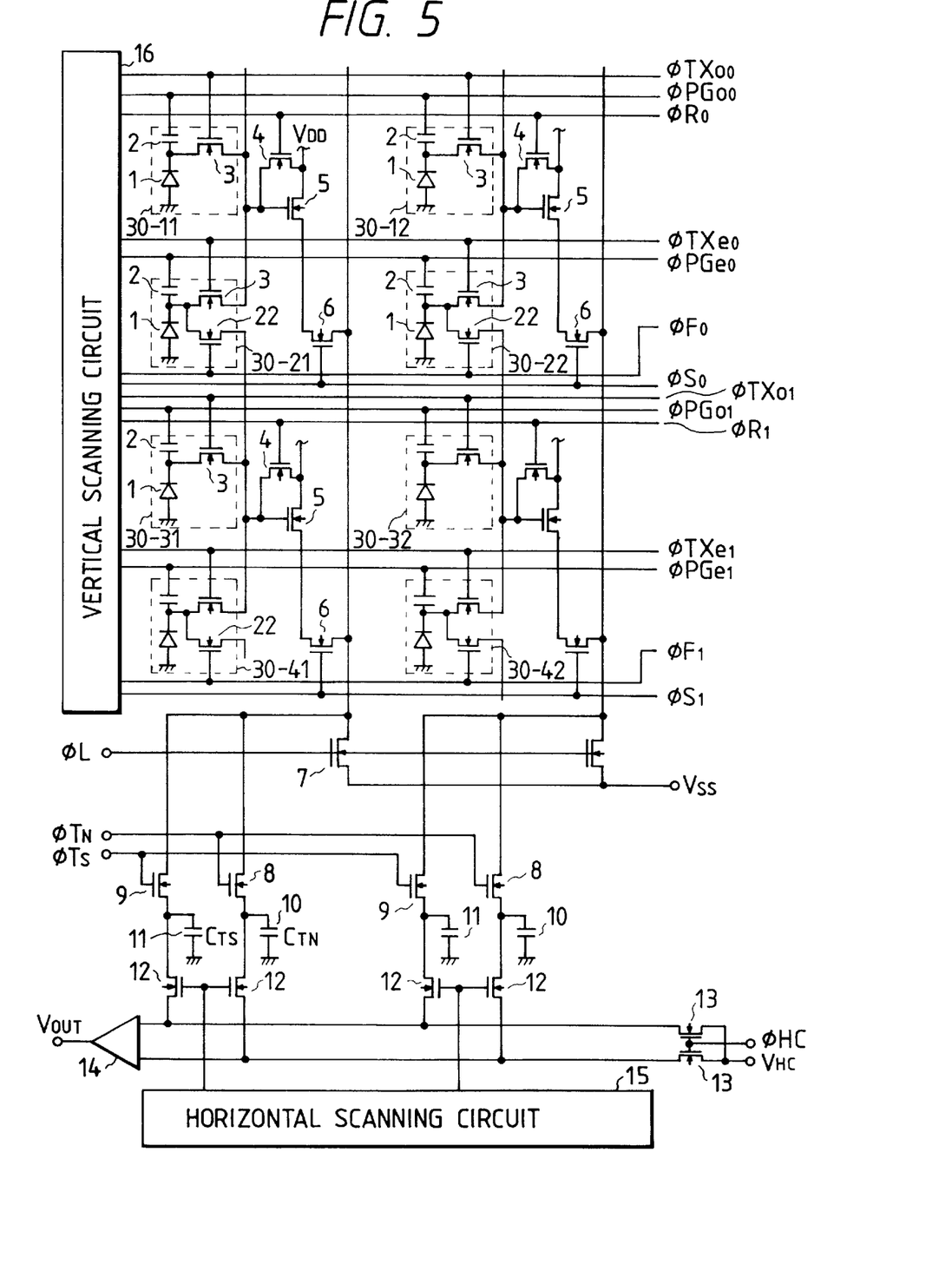
FIG. 5 is a schematic circuit constructional diagram of the second embodiment according to the invention.

FIG. 5 shows a schematic circuit diagram of the second embodiment according to the invention. The embodiment is characterized by providing a transfer switch 22 so that a color difference line sequential driving can be performed. In the first embodiment, although the addition of the first and second lines and the addition of the third and fourth lines can be performed, the addition of the second and third lines cannot be performed. In the embodiment, since the transfer switch 22 exists, the addition of the second and third lines can be executed.

Figure 3:
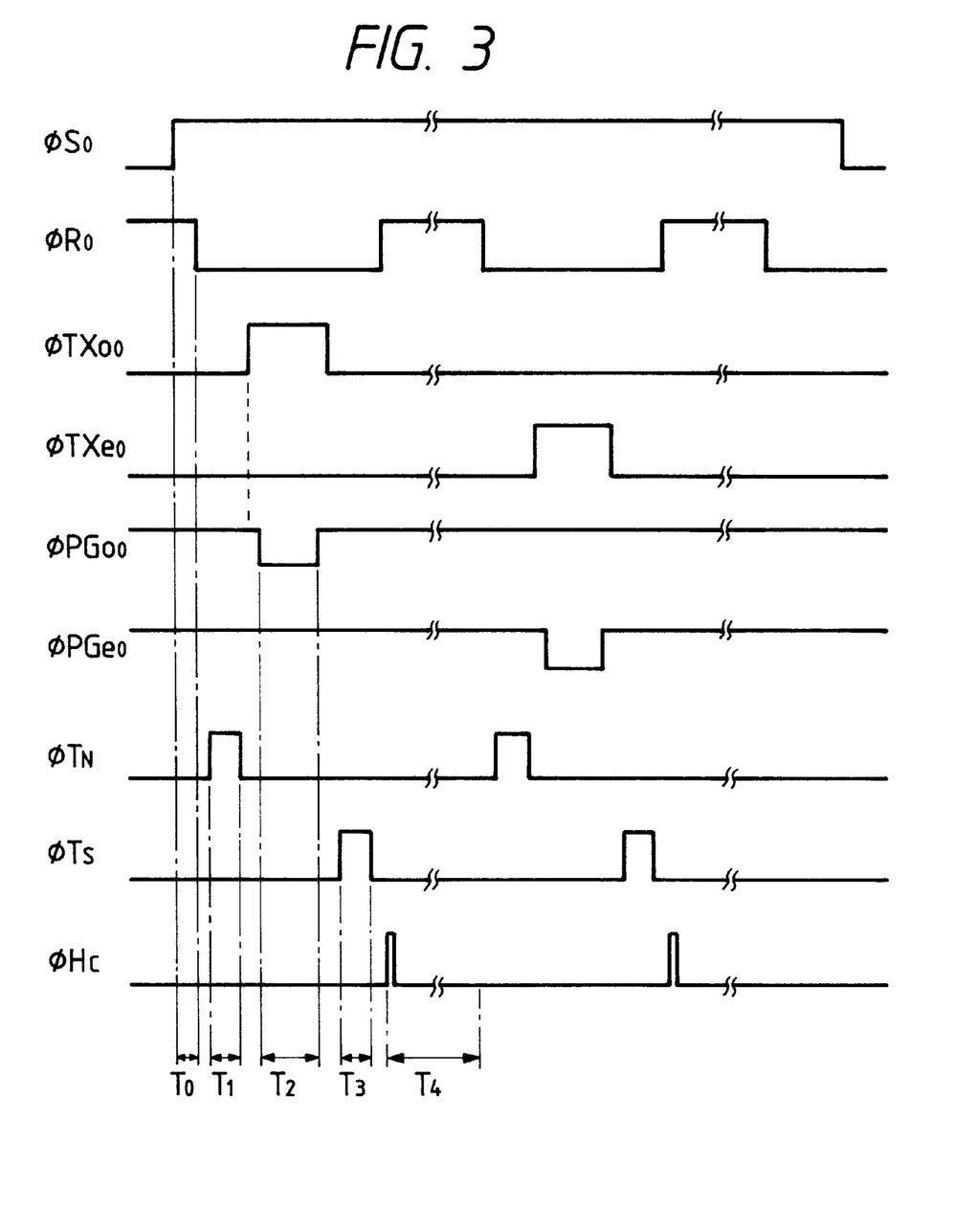
FIG. 3 is a timing chart (1) in the first embodiment according to the invention.
Figure 4:
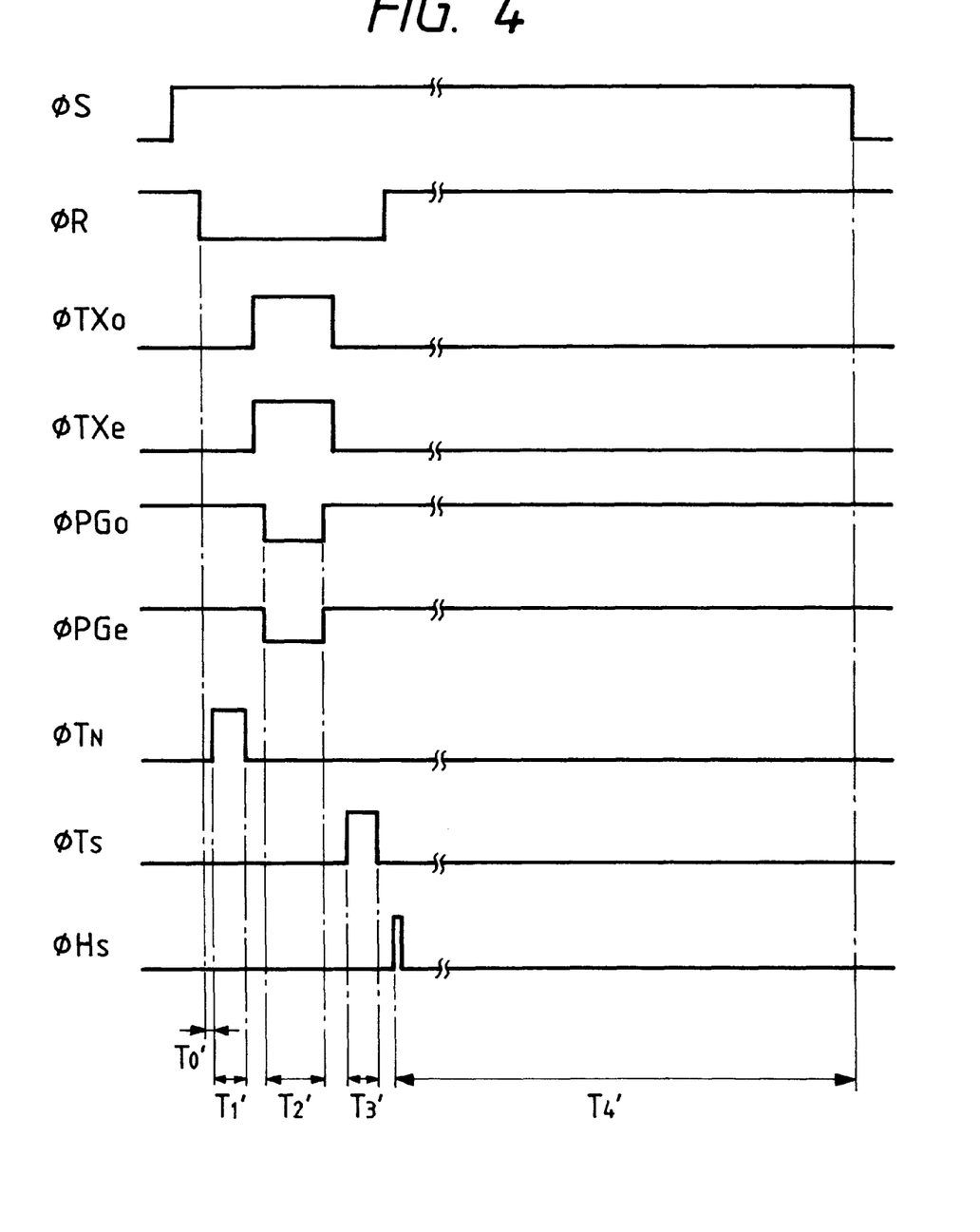
FIG. 4 is a timing chart (2) in the first embodiment according to the invention.

In case of adding the second and third lines, when the first line is read out, the operation advances from time T0 to time T4 at a timing in FIG. 3 and, after that, when reading out the second line, the control pulses φTXe0 and φTXo1 and the control pulses φPGe0 and φPGe1 are simultaneously set to the H level and the low level, the control pulse φF is also set to the high level simultaneously with the control pulse φTXe0, and the other control pulses are also similarly supplied. The pixel signals of the pixels 30-21 and 30-31 are accumulated in the accumulating capacitor 11. The noise components can be cancelled and the pixel signal output $V_{OUT}$ can be obtained. After that, the pixel signals of pixels 30-22 and 30-32 are accumulated into the accumulating capacitor 11 and a pixel signal output $V_{OUT}$ can be obtained. Subsequently, by supplying similar control pulses with respect to the third and fourth lines and pixel signals of pixels 30-31 and 30-41 and pixel signals of pixels 30-32 and 30-42 can be sequentially read out.

Figure 6:
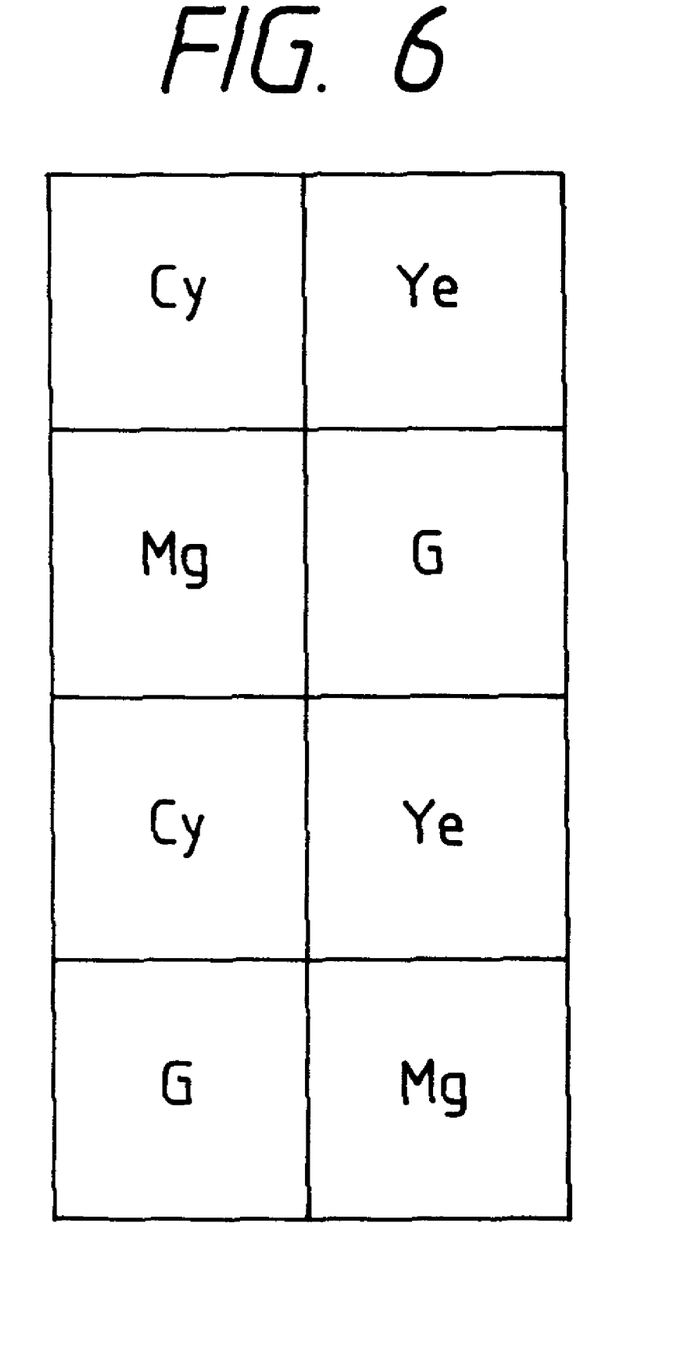
FIG. 6 is a diagram of an on-chip color filter in the second embodiment according to the invention.

Therefore, if a complementary color mosaic type filter as shown in FIG. 6 is formed on the circuit construction chip of FIG. 5, according to the scan of the NTSC system, outputs of ($C_y$+$M_g$) and ($Y_e$+G) as sums of, for example, the first and second lines and outputs of ($C_y$+G) and ($Y_e$+$M_g$) as sums of, for example, the third and fourth lines can be sequentially obtained in an ODD (odd number) field. Even in an EVEN (even number) field, outputs of ($C_y$+$M_g$) and ($Y_e$+G) as sums of, for example, the second and third lines and outputs of ($C_y$+G) and ($Y_e$+$M_g$) as sums of, for example, the third and fourth lines can be sequentially obtained. Two carrier chrominance signals of the I axis (orange and cyan system) and the Q axis (green and magenta system) in the TV scan (NTSC, HD) of the interlace scan can be easily formed.

In the embodiment as well, it will be also obviously understood that outputs of all of the pixels can be independently performed by changing a supplying timing of the drive timing. Namely, if a control pulse φF is always set to the L level, the operation of the transfer switch 22 is turned off and the pixel signals can be read out every output of each pixel in accordance with a time sequence on the basis of the timing shown in FIG. 3.

According to the embodiment, therefore, the sum signal of the pixels which are deviated by one line can be outputted. Not only the apparatus can cope with the TV scan but also the pixel signals can be time sequentially independently read out every pixel or the sum signals of two pixels can be read out. Therefore, a variety of image pickup operations can be performed in accordance with the image pickup environment.

In the embodiment, in particular, if the color difference line sequential driving (interlace, color signal addition output) system is performed, the memory and the external adding circuit which are necessary for the first embodiment become unnecessary and the conventional signal processing circuit for a CCD can be used as it is. Therefore, it is advantageous in terms of costs and an installation.

Figure 7:
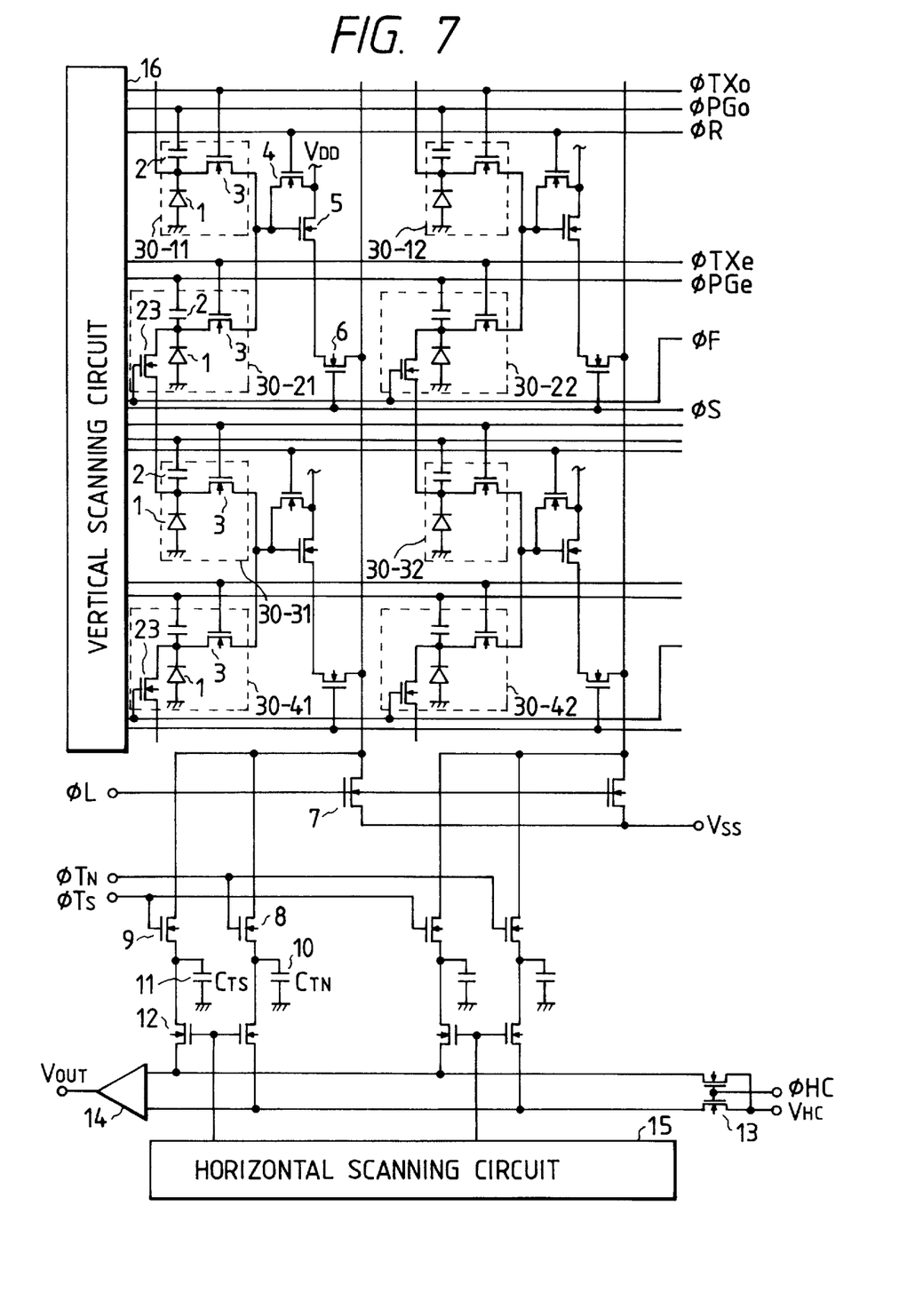
FIG. 7 is a schematic circuit constructional diagram of the third embodiment according to the invention.

FIG. 7 shows a conceptual circuit diagram of the third embodiment according to the invention. The embodiment is characterized in that, when the pixel signals are added, a switch MOS transistor 23 which can perform not only the addition in the FD portion by the timing shown in FIG. 4 but also the addition in the photoelectric converting unit is provided.

In FIG. 7, a timing of each control pulse is similar to that in the second embodiment. After the first line was read out, even when the second and third lines are subsequently read out, the control pulse φF is also set to the H level simultaneously with the control pulse φTXe0. The charges of the photoelectric converting unit 1 of the pixel 30-21 and the charges of the photoelectric converting unit 1 of the pixel 30-31 are added by making the switch MOS transistor 23 conductive. The added charges are transferred to the accumulating capacitor 11 through the source-follower MOS transistor 5 and selection switch MOS transistor 6 by making the transfer MOS transistor 3 of the pixel 30-21 conductive.

By forming the complementary color mosaic type filter shown in FIG. 6, in a manner similar to the second embodiment, outputs of ($C_y$+$M_g$) and ($Y_e$+G) as sums of, for example, the first and second lines and outputs of ($C_y$+G) and ($Y_e$+$M_g$) as sums of, for example, the third and fourth lines can be sequentially obtained in the ODD (odd number) field. Outputs of ($C_y$+$M_g$) and ($Y_e$+G) as sums of, for example, the second and third lines and outputs of ($C_y$+G) and ($Y_e$+$M_g$) as sums of, for example, the third and fourth lines can be sequentially obtained in the EVEN (even number) field.

Therefore, in the interlace driving, the addition is performed in the FD portion in the ODD field and the other charges are transferred to the other well and are added by the pixel portion in the EVEN field and the added charges are outputted to the FD portion. The above operations can be also obviously reversed in the EVEN field and the ODD field. In the embodiment, the TV scan can be performed without increasing the capacitance of the FD portion. By variably changing the timing of each control pulse, a variety of image signals can be also obtained in a manner similar to the second embodiment. Further, even in the embodiment, by executing a color difference line sequential driving in a manner similar to the second embodiment, there is an advantage such that the conventional signal processing circuit can be used as it is.

Figure 8:
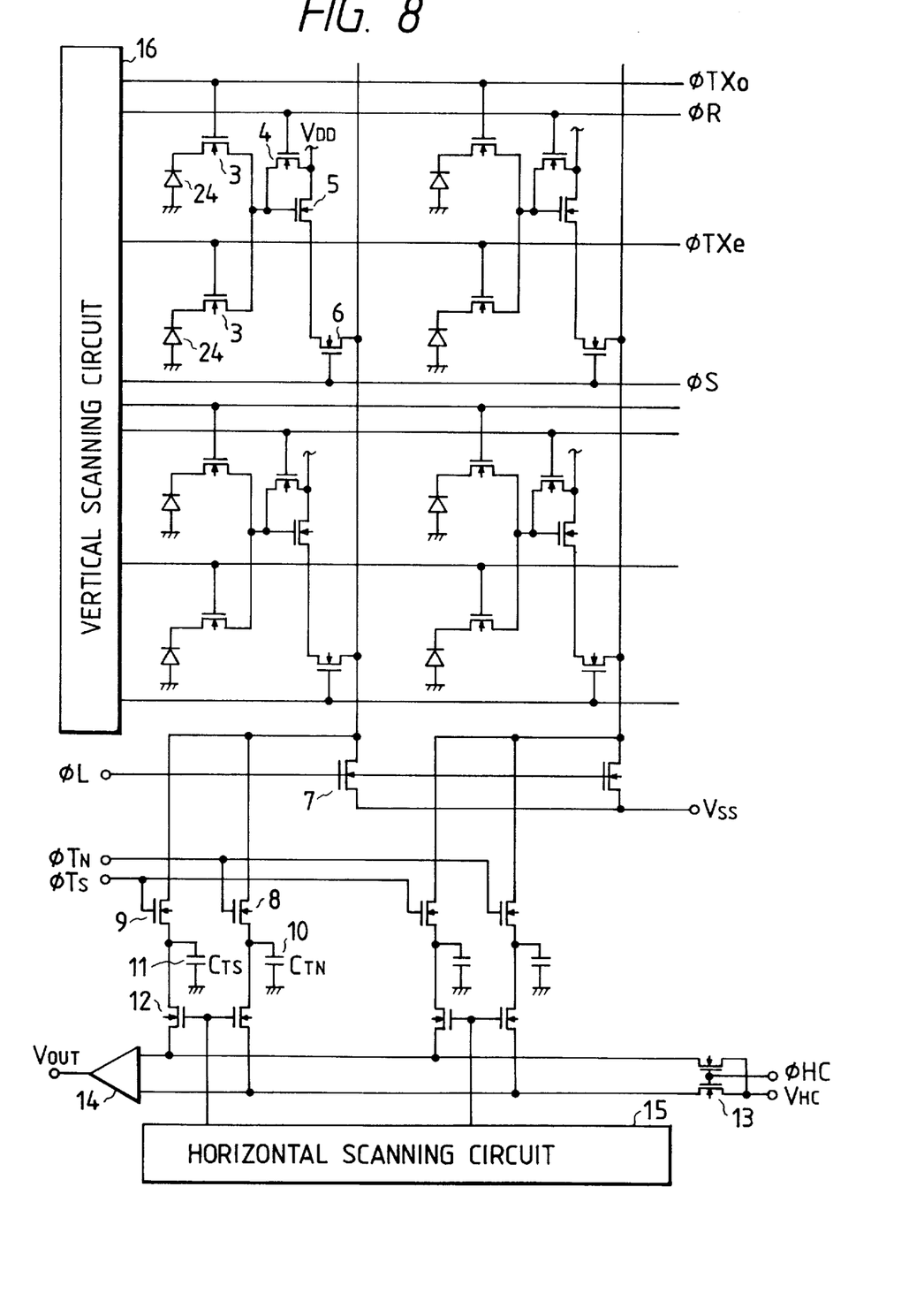
FIG. 8 is a schematic circuit constructional diagram of the fourth embodiment according to the invention.
Figure 9:
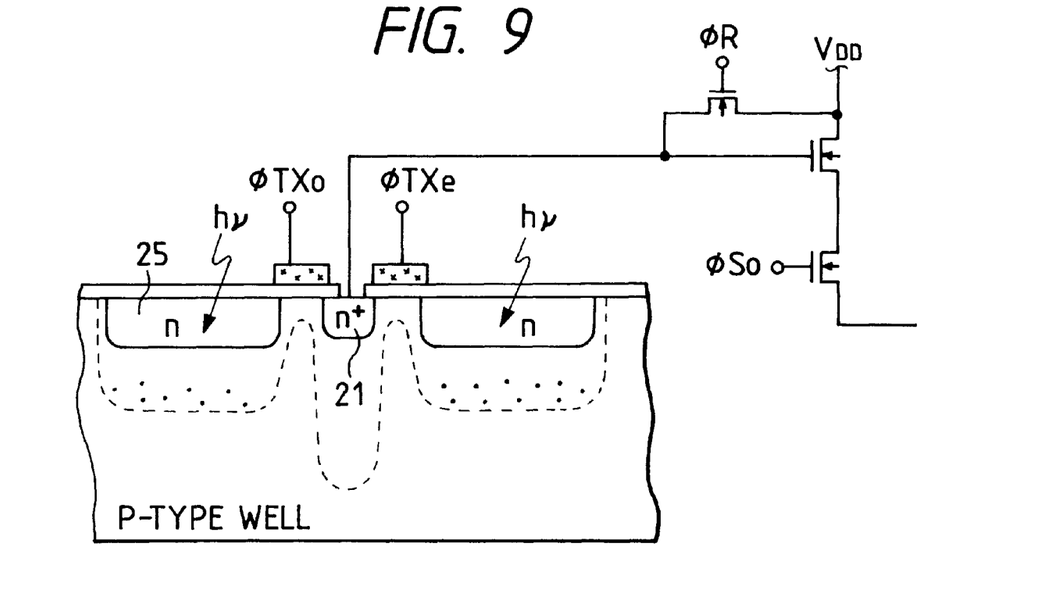
FIG. 9 is a cross sectional view of a pixel in the fourth embodiment according to the invention.

FIG. 8 shows a conceptual circuit diagram of the fourth embodiment according to the invention. The embodiment is characterized in that no photo gate is used in the photoelectric converting unit but a pn photodiode 24 is used. FIG. 9 shows a cross sectional view of a pixel. In the diagram, reference numeral 25 denotes an n-type layer having a density such that it can be perfectly formed to a depletion layer. Charges generated by the control pulse φTX are completely transferred to the FD portion. In this case of the embodiment as well, the addition and non-addition of signals can be executed by control pulses φTX even in the fourth embodiment.

The operation of FIGS. 8 and 9 will be described. First, the control pulse φR is set to the H level and the FD portion 21 is reset to the power source voltage $V_{DD}$. By setting the control pulse φS to the H level and the dark output is accumulated in the accumulating capacitor 10. Subsequently, the control pulse φTXo0 is set to the H level and the photo charges accumulated in the pn photodiode 24 are transferred to the accumulating capacitor 11 through the source-follower MOS transistor 5 and selection switch MOS transistor 6. The noise component is cancelled by the differential output amplifier 14 and the image signal $V_{OUT}$ is generated. By supplying control pulses corresponding to the timing in FIG. 4, the charges can be added to two pn photodiodes 24 and the added charges can be read out.

By adding the switch MOS transistor, an image output having a high efficiency in the interlace scan can be obtained in a manner similar to the second and third embodiments.

Figure 10:
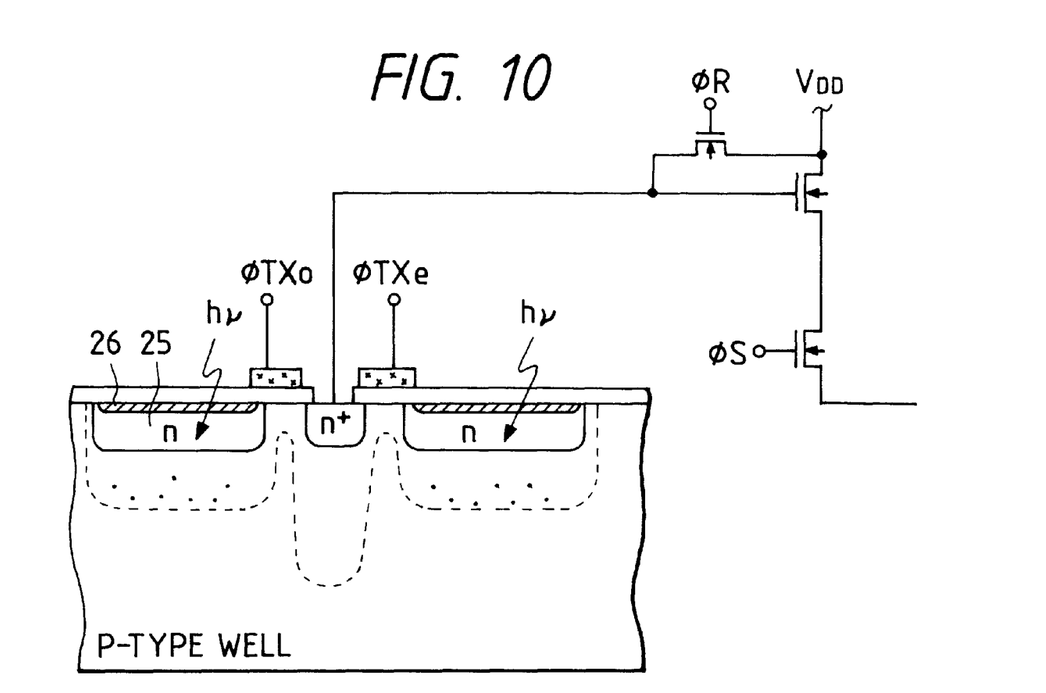
FIG. 10 is a cross sectional view of a pixel in the fifth embodiment according to the invention.

FIG. 10 shows a pixel cross sectional view of the fifth embodiment according to the invention. In the diagram, reference numeral 26 denotes a surface $p^+$-type layer. The fifth embodiment is characterized in that the surface $p^+$-type layer 26 constructs the photoelectric converting unit together with the n-type layer 25 and a pixel is formed by a buried type photodiode. With such a structure, a dark current which is generated in the surface can be suppressed. As compared with FIG. 9, since high photo charges of a good efficiency can be obtained, an image signal of a high S/N ratio and a high quality can be obtained.

According to the pixel of the structure shown in FIG. 10, a similar image output can be obtained by a timing of each control pulse which is provided in place of the pn photodiode 24 in FIG. 8 and is similar to that in the fourth embodiment.

According to the invention as described above, since a CMOS transistor type sensor in which the number of devices is reduced and a high numerical aperture and a fine structure can be obtained can be realized, there are advantages such as high yield due to an increase in integration, low costs, miniaturization of a package, and miniaturization of the optical system.

Since the addition and non-addition of the pixel signals can be realized by only a driving method, there is also an advantage such that the invention can cope with various operating methods including the conventional XY addressing function.

Many widely different embodiments of the present invention may be constructed without departing from the spirit and scope of the present invention. It should be understood that the present invention is not limited to the specific embodiments described in the specification, except as defined in the appended claims.

What is claimed is:

1. A solid state image pickup apparatus for transferring charges generated by a photoelectric converting device to a floating diffusion portion through a transfer switch and for outputting a change in electric potential of said floating diffusion portion to an output side through a buffer amplifier, wherein
   a plurality of said photoelectric converting devices are connected to said one floating diffusion portion through respective transfer switches and each said buffer amplifier is formed for more than one of said plurality of photoelectric converting devices.

2. An apparatus according to claim 1, wherein said photoelectric converting device comprises an MOS transistor gate and a depletion layer under said gate.

3. An apparatus according to claim 2, wherein said MOS transistor gate of said photoelectric converting device is formed by a same processing step as that of an MOS transistor of a peripheral circuit.

4. An apparatus according to claim 1, wherein said photoelectric converting device is a pn junction photodiode.

5. An apparatus according to claim 1, wherein the charges of a plurality of said photoelectric converting devices can be simultaneously or separately transferred to said floating diffusion portion.

6. An apparatus according to claim 1, wherein image signal outputs are obtained by arranging a plurality of solid state image pickup apparatuses.

7. An apparatus according to claim 6, wherein charges of at least two said photoelectric converting devices are added to said floating diffusion portion.

8. An apparatus according to claim 6, wherein upon reading of said photoelectric converting device, an image signal from a complementary color mosaic pattern is obtained synchronously with ODD and EVEN fields by an interlace scan.

9. A solid state image pickup apparatus comprising:
   a plurality of photoelectric conversion means each for generating a photoelectric conversion signal;
   transfer switch means for transferring the signals generated by said plurality of photoelectric conversion means to a floating diffusion portion; and
   output amplifier means provided for said plurality of photoelectric conversion means, for outputting change of electric potential in said floating diffusion portion to an output side.

10. An apparatus according to claim 9, wherein each of said plurality of photoelectric converting means comprises an MOS transistor gate and a depletion layer under said gate.

11. An apparatus according to claim 10, wherein said MOS transistor gate of the photoelectric converting means is formed by a same processing step as that of an MOS transistor of a peripheral circuit.

12. An apparatus according to claim 9, wherein each of said photoelectric converting means is a pn junction photodiode.

13. An apparatus according to claim 9, wherein the signals generated by said plurality of said photoelectric converting means can be simultaneously or separately transferred to said floating diffusion portion.

14. An apparatus according to claim 9, wherein charges of at least two said photoelectric converting devices are added to said floating diffusion portion.

15. An apparatus according to claim 14, wherein upon reading of said plurality of photoelectric converting means, an image signal from a complementary color mosaic pattern is obtained synchronously with ODD and EVEN fields by an interlace scan.

16. A solid-state image pickup apparatus comprising a plurality of photoelectric converting means each for generating a photoelectric conversion signal;
   complete transfer means for completely transferring the signals generated by the photoelectric converting means to a common floating diffusion portion; and
   output amplifier means for amplifying change of electric potential in said common floating diffusion portion to an output side.

17. A solid-state image pickup apparatus comprising:
   (A) a plurality of units, each of said plurality of units including:
      (a) a plurality of photoelectric converting means each for generating a photoelectric conversion signal;
      (b) transfer switch means for transferring the signals generated by said plurality of photoelectric converting means to a common floating diffusion portion; and
      (c) output amplifier means for amplifying change of electric potential in said common floating diffusion portion to an output side; and
   (B) addition means for outputting an addition signal of signals from more than two photoelectric converting means, through said output amplifier means.

18. An apparatus according to claim 17, wherein said addition means output the addition signal of signals from more than two photoelectric converting means included in one unit.

19. An apparatus according to claim 18, further comprising separate signal output means for outputting the signal from each of said plurality of photoelectric converting means included in one unit.

20. An apparatus according to claim 17, wherein said addition means adds signals from the plurality of photoelectric converting means included in the plurality of units.

21. An apparatus according to claim 20, wherein said addition means adds, at the floating diffusion portion, signals from the plurality of photoelectric converting means included in different units.

22. An apparatus according to claim 21, wherein said addition means includes means for connecting the plurality of photoelectric converting means included in said different units.

23. A solid state image pickup apparatus comprising a plurality of photoelectric converting means each for generating a photoelectric conversion signal;
   transfer switch means for transferring the signals generated by said plurality of photoelectric converting means to a common floating diffusion portion; and
   output amplifier means for amplifying change of electric potential in said common floating diffusion portion to an output side;
   wherein said photodiode converting means comprises a photodiode of a buried type.

24. A solid-state image pickup apparatus comprising:
   a plurality of photoelectric converting means arranged in horizontal and vertical directions, each for generating a photoelectric conversion signal;
   transfer switch means for transferring the signals generated by said plurality of photoelectric converting means to a common floating diffusion portion;

a plurality of vertical output line;

output amplifier means for amplifying change of electric potential in said common floating diffusion portion to each vertical output line;

first storage means provided on said vertical output line;

second storage means provided on said vertical output line; and difference means for generating a difference between a signal output from said first storage means and a signal output from said second storage means.

25. A solid-state image pickup apparatus comprising:

a plurality of units arranged in a two-dimensional form;

wherein each of said plurality of units includes:

(a) a plurality of photoelectric converting means each for generating a photoelectric conversion signal;

(b) transfer switch means for transferring the signals generated by said plurality of photoelectric converting means to a common floating diffusion portion;

(c) output amplifier means for amplifying change of electric potential in said common floating diffusion portion to an output side; and (d) selection switch means for outputting a signal from said output amplifier means, to an output side.

26. An apparatus according to claim 25, further comprising control means for controlling a plurality of said selection switch means simultaneously.

27. An apparatus according to claim 26, wherein said control means controls a plurality of said selection switch means in a predetermined direction, simultaneously.

* * * * *

UNITED STATES PATENT AND TRADEMARK OFFICE
CERTIFICATE OF CORRECTION

PATENT NO.    : 5,955,753
DATED         : September 21, 1999
INVENTOR(S)   : HIDEKAZU TAKAHASHI It is certified that error appears in the above-identified patent and that said Letters Patent is hereby corrected as shown below:

COLUMN 1

Line 30, "cross sectional" should read --cross-sectional--.

COLUMN 3

Line 19, "cross sectional" should read --cross-sectional--;
Line 35, "cross sectional" should read --cross-sectional--; and
Line 37, "cross sectional" should read --cross-sectional--.

COLUMN 4

Line 3, "cross sectional" should read --cross-sectional--.

COLUMN 8

Line 12, "cross sectional" should read --cross-sectional--; and
Line 37, "cross sectional" should read --cross-sectional--.

UNITED STATES PATENT AND TRADEMARK OFFICE
CERTIFICATE OF CORRECTION

PATENT NO.   : 5,955,753
DATED        : September 21, 1999
INVENTOR(S)  : HIDEKAZU TAKAHASHI It is certified that error appears in the above-identified patent and that said Letters Patent is hereby corrected as shown below:

COLUMN 10

Line 31, "output" should read --outputs--.

Signed and Sealed this

Twenty-fourth Day of October, 2000

*Attest:*

Q. TODD DICKINSON

*Attesting Officer*     *Director of Patents and Trademarks*